United States Patent
Irfanullah et al.

(10) Patent No.: US 10,634,748 B2
(45) Date of Patent: Apr. 28, 2020

(54) GRAPHICAL PROCESSING UNIT (GPU) IMPLEMENTATION OF MAGNETIC RESONANCE FINGERPRINTING (MRF)

(71) Applicant: COMSATS Institute of Information Technology, Islamabad (PK)

(72) Inventors: Irfanullah, Islamabad (PK); Hammad Omer, Islamabad (PK)

(73) Assignee: COMSATS Institute of Information Technology, Islamabad (PK)

(*) Notice: Subject to any disclaimer, the term of this patent is extended or adjusted under 35 U.S.C. 154(b) by 160 days.

(21) Appl. No.: 15/629,412

(22) Filed: Jun. 21, 2017

(65) Prior Publication Data
US 2017/0371015 A1  Dec. 28, 2017

(30) Foreign Application Priority Data
Jun. 22, 2016 (PK) .................... 378/2016

(51) Int. Cl.
G01R 33/48 (2006.01)
G01R 33/561 (2006.01)
G01R 33/50 (2006.01)

(52) U.S. Cl.
CPC ......... *G01R 33/4828* (2013.01); *G01R 33/50* (2013.01); *G01R 33/5611* (2013.01)

(58) Field of Classification Search
None
See application file for complete search history.

(56) References Cited

U.S. PATENT DOCUMENTS

| 9,633,455 | B1* | 4/2017 | Mailhe | G06T 11/008 |
|---|---|---|---|---|
| 9,897,675 | B2* | 2/2018 | Setsompop | G01R 33/4828 |
| 2015/0071360 | A1* | 3/2015 | Nguyen | H04N 19/597 |
| | | | | 375/240.18 |
| 2015/0302579 | A1* | 10/2015 | Griswold | G01R 33/5608 |
| | | | | 382/128 |
| 2015/0346300 | A1* | 12/2015 | Setsompop | G01R 33/4828 |
| | | | | 324/309 |
| 2016/0125565 | A1* | 5/2016 | Sulatycke | G06T 1/20 |
| | | | | 345/522 |
| 2016/0178720 | A1* | 6/2016 | Mailhe | G01R 33/5611 |
| | | | | 324/309 |
| 2016/0349341 | A1* | 12/2016 | Cohen | A61B 5/055 |
| 2017/0234951 | A1* | 8/2017 | Zhao | G01R 33/50 |
| | | | | 324/309 |
| 2017/0371020 | A1* | 12/2017 | Shahzad | G01R 33/5611 |
| 2018/0203082 | A1* | 7/2018 | Griswold | G01R 33/5608 |
| 2018/0292484 | A1* | 10/2018 | Hoppe | G01R 33/50 |

OTHER PUBLICATIONS

Benoit-Cattin et al, Magnetic Resonance Imaging (MRI) Simulation on a Grid Computing Architecture, Apr. 27, 2010 (Year: 2010).*

(Continued)

*Primary Examiner* — Jermele M Hollington
(74) *Attorney, Agent, or Firm* — H.C. Park & Associates, PLC (57) ABSTRACT

A method including writing of kernel modules to process Magnetic Resonance (MR) data acquired from MRI Scanner using a parallel implementation of Magnetic Resonance Fingerprinting (MRF) algorithm on a parallel architecture; and launching multiple threads simultaneously.

8 Claims, 8 Drawing Sheets

(56) References Cited

OTHER PUBLICATIONS

Nataraj et al, Dictionary-Free MRI Perk: Parameter Estimation via Regression with Kernels, Oct. 6, 2017, IEEE (Year: 2017).*

Christos G. Xanthis et al, Parallel simulations for QUAntifying Relaxation magnetic resonance constants (SQUAREMR): an example towards accurate MOLLI T1 measurements, 2015, Journal of Cardiovascular Magnetic Resonance, vol. 17:104, pp. 1-15 (Year: 2015).*

Christos G. Xanthis et al, MRISIMUL: A GPU-Based Parallel Approach to MRI Simulations, Mar. 2014, IEEE Transactions on Medical Imaging, vol. 33, No. 3, pp. 607-617 (Year: 2014).*

Debra F. McGivney et al, SVD Compression for Magnetic Resonance Fingerprinting in the Time Domain, Dec. 2014 IEEE Transactions on Medical Imaging, vol. 33, No. 12, pp. 2311-2322 (Year: 2014).*

Mohamed Ben Salah et al, Convex-Relaxed Kernel Mapping for Image Segmentation, Mar. 2014, IEEE Transactions on Image Processing, vol. 23, No. 3, pp. 1143-1153 (Year: 2014).*

Dan Ma et al. "Magnetic resonance fingerprinting", Nature, Mar. 14, 2013, pp. 187-193, vol. 495, Macmillan Publishers Limited.

* cited by examiner

GRAPHICAL PROCESSING UNIT (GPU) IMPLEMENTATION OF MAGNETIC RESONANCE FINGERPRINTING (MRF)

CROSS-REFERENCE TO RELATED APPLICATION

This application claims priority from and the benefit of Pakistani Provisional Patent Application No. 378/2016, filed on Jun. 22, 2016, which is hereby incorporated by reference for all purposes as if fully set forth herein.

BACKGROUND

Field

In MRI, the principles of Nuclear Magnetic Resonance (NMR) spectroscopy and MR therapy are utilized to produce information about different tissues and their properties. The tissues in different organs of the human body can be identified with MRI, based on different parameters such as the longitudinal relaxation time (T1) and the transverse relaxation time (T2). MRI has enabled the physicians to detect and diagnose abnormalities in the patient's body. The contrast between different tissues is used to characterize a pathology. The current MRI technology examines limited set of tissue parameters at once. However, Magnetic Resonance Fingerprinting (MRF), an innovative method can quantitatively examine many magnetic resonance tissue parameters simultaneously. Thus, MRF opens the door to computer-aided multiparametric magnetic resonance analyses, like genomic or proteomic analyses, that could detect important but complex changes across many magnetic resonance parameters simultaneously.

Discussion of the Background

MRF is a technique that promises to efficiently quantify multiple parameters of human body tissues such as T1 and T2 simultaneously. Instead of acquiring data by providing a constant signal level over time for characterizing individual parameter of interest, a pulse sequence with varying acquisition parameters is applied in a pseudorandom manner to produce unique signal evolution or 'fingerprint' for each type of tissue. MRF has the potential to quantitatively analyze different MR parameters simultaneously as compared to conventional MRI techniques. Therefore, when a suitable pattern recognition algorithm is used, various tissue parameters of interest can be acquired. The most common tissue parameters that relate to diseases are the T1 relaxation time, T2 relaxation time, off resonance frequency and the proton density. These parameters have been observed to be affected by critical diseases. It is expected that different diseases such as epilepsy, schizophrenia, Alzheimers among others can be detected with the help of MRF in their early stages while they are still curable. The added advantage of MRF is its tolerance to motion artefacts.

MRF consists of two main modules, (i) MRF Dictionary Development and (ii) Pattern Matching algorithm. MRF dictionary contains free induction decays for different values of T1 and T2 which are simulated using the Bloch—McConnell equations. MRF dictionary comprises of signal evolution from all the possible combinations of material and system related tissue parameters such as repetition time (TR), echo time (TE) and flip angle (FA) of the RF pulses. Pattern matching is performed between the signal acquired from the MR scan and the MRF dictionary. The signal evolution contained in a voxel is compared with all the entries in the MRF dictionary. The pattern matching algorithm is used to find the dictionary entry that has maximum correlation with the acquired signal evolution of each voxel. The parameters that are used to simulate the resulting match are assigned to the voxel.

The MRF process is quite like fingerprint processing used in forensic studies. In forensic studies, when a positive match of fingerprint (that is unique) is made with the dictionary, detailed information such as the individual's name, age etc is obtained. Similarly, in case of MRF, each signal evolution in the dictionary points to the MR parameters of interest for each tissue. These parameters can then be used to derive quantitative maps such as T1 map and T2 map. Once these quantitative parameter maps are obtained, it may be possible to identify the tissue properties and provide information to improve diagnostic assessment.

The execution of MRF dictionary development and Pattern Matching algorithm requires considerable amount of computation time. Therefore, one main limitation of MRF to make it clinically realizable is the long computation time. The MRF dictionary has a huge size because it contains all the possible combinations of different parameters for each tissue. The pattern matching algorithm would take a considerable amount of computation time to match the signal evolution (fingerprint) with the samples in the dictionary and produces quantitative maps.

Thus, it is desirable to implement MRF algorithm (MRF Dictionary and MRF Pattern Matching algorithm) on Graphical Processing Units (GPUs) to exploit inherent parallelism and to decrease the computation time to make MRF algorithm clinically realizable.

GPU can handle computationally intensive tasks by performing operations in parallel if the data to be processed is independent. GPU consists of multiple thousand cores that enable GPU to perform thousands of arithmetic operations simultaneously. The iterative implementations on CPU can be parallelized on GPU providing that the data to be processed is totally independent. The data is independent only if the operations performed on the data are independent of the operations performed or modification in other data elements in the database.

All the dictionary elements in MRF are totally independent of each other. Each pixel and its computation are totally independent from the neighboring pixels and hence, it is possible to compute each of them in parallel. Similarly, all the elements in MRF pattern matching algorithm are totally independent of each other. So, similar concept of parallelism can be used for MRF pattern matching algorithm.

The above information disclosed in this Background section is only for enhancement of understanding of the background of the inventive concepts, and, therefore, it may contain information that does not form the prior art that is already known in this country to a person of ordinary skill in the art.

SUMMARY

According to exemplary embodiments, a method includes writing of kernel modules to process Magnetic Resonance (MR) data acquired from MRI Scanner using a parallel implementation of Magnetic Resonance Fingerprinting (MRF) algorithm on a parallel architecture using; and launching multiple threads simultaneously.

The kernel modules may be CUDA kernel modules.

The multiple threads may be CUDA kernel threads.

The method according an exemplary embodiment may be implemented on a GPU.

The method according an exemplary embodiment may be implemented on a CPU and a GPU.

The method according an exemplary embodiment includes the parallel architecture supporting a CUDA framework.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

In exemplary embodiments, different types of modules referred herein, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, different types of modules referred herein, and/or one or more components thereof may include or otherwise be associated with one or more memories (not shown) including code (e.g., instructions) configured to cause different types of modules referred herein, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire, and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

According to exemplary embodiments, MRF dictionary and pattern matching algorithms are implemented on CPU using C language and on GPU using Compute Unified Device Architecture (CUDA) framework to improve the computation time of MRF. GPUs using CUDA can handle large amounts of data and performs independent computations on them. The main advantage of using GPU in MRF is the number of cores available for data processing and the ability to perform multiple operations simultaneously. It is expected that GPU significantly decreases the computation time of the MRF algorithms by exploiting inherent parallelism.

MRF dictionary is one of the main components of the MRF algorithm. The dictionary is based on the Bloch equations. Bloch equations can precisely simulate the effects of excitation and de-excitation (by RF pulses) of the hydrogen molecules. Collectively, these equations simulate two NMR rotations (excitation rotation and precession rotation) and the Free Induction Decay (FID) of the hydrogen nuclei.

Figure 1:
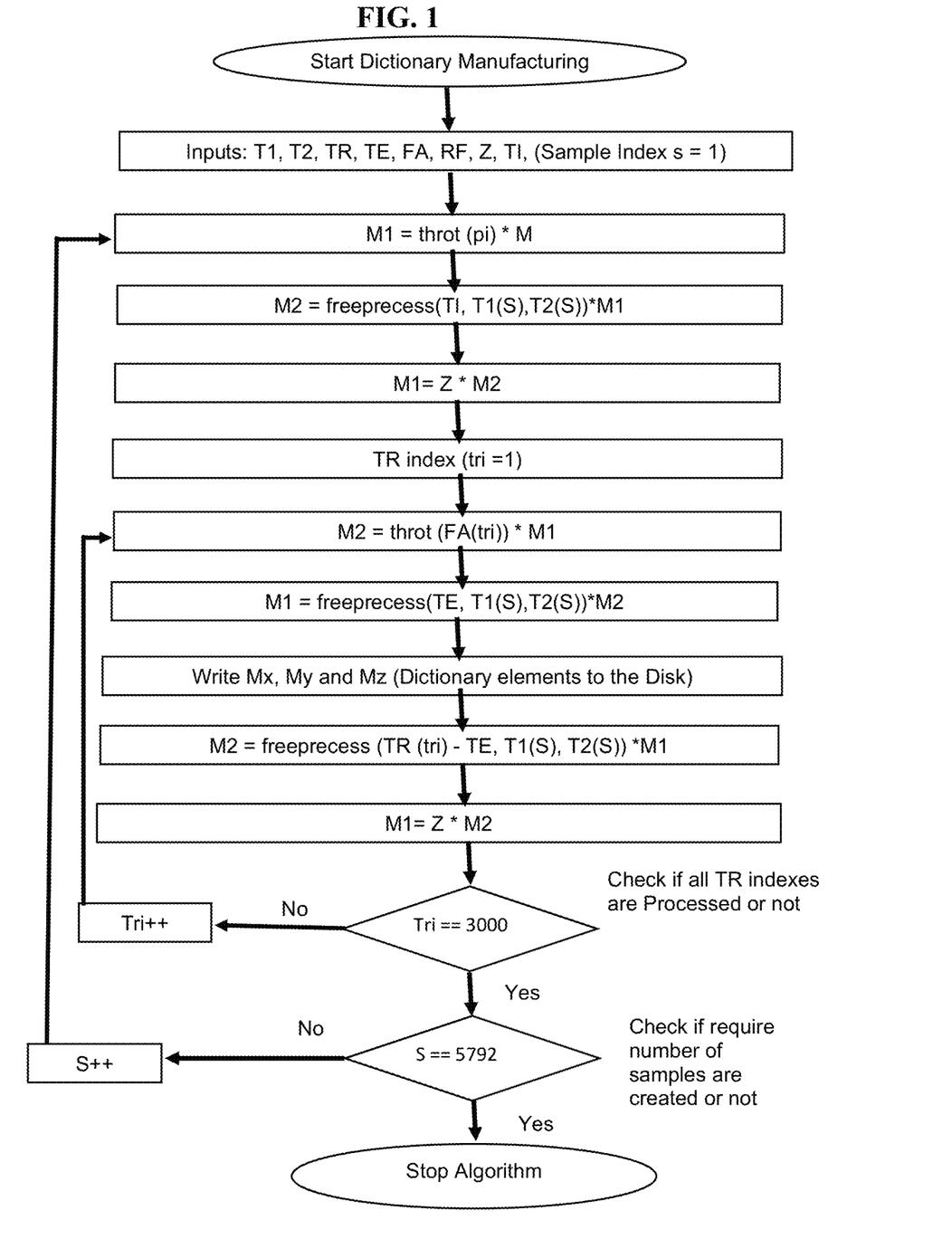
FIG. 1 is a flow chart for sequential implementation of the MRF dictionary according to an exemplary embodiment.

FIG. 1 is a flow chart for sequential implementation of the MRF dictionary according to an exemplary embodiment. The MRF dictionary consists of signal evolution from all the possible combination of T1 values, T2 values, pulse repetition time, echo time, flip angle, the RF pulse sequence, precession rotation (Z) and inversion time.

Figure 2:
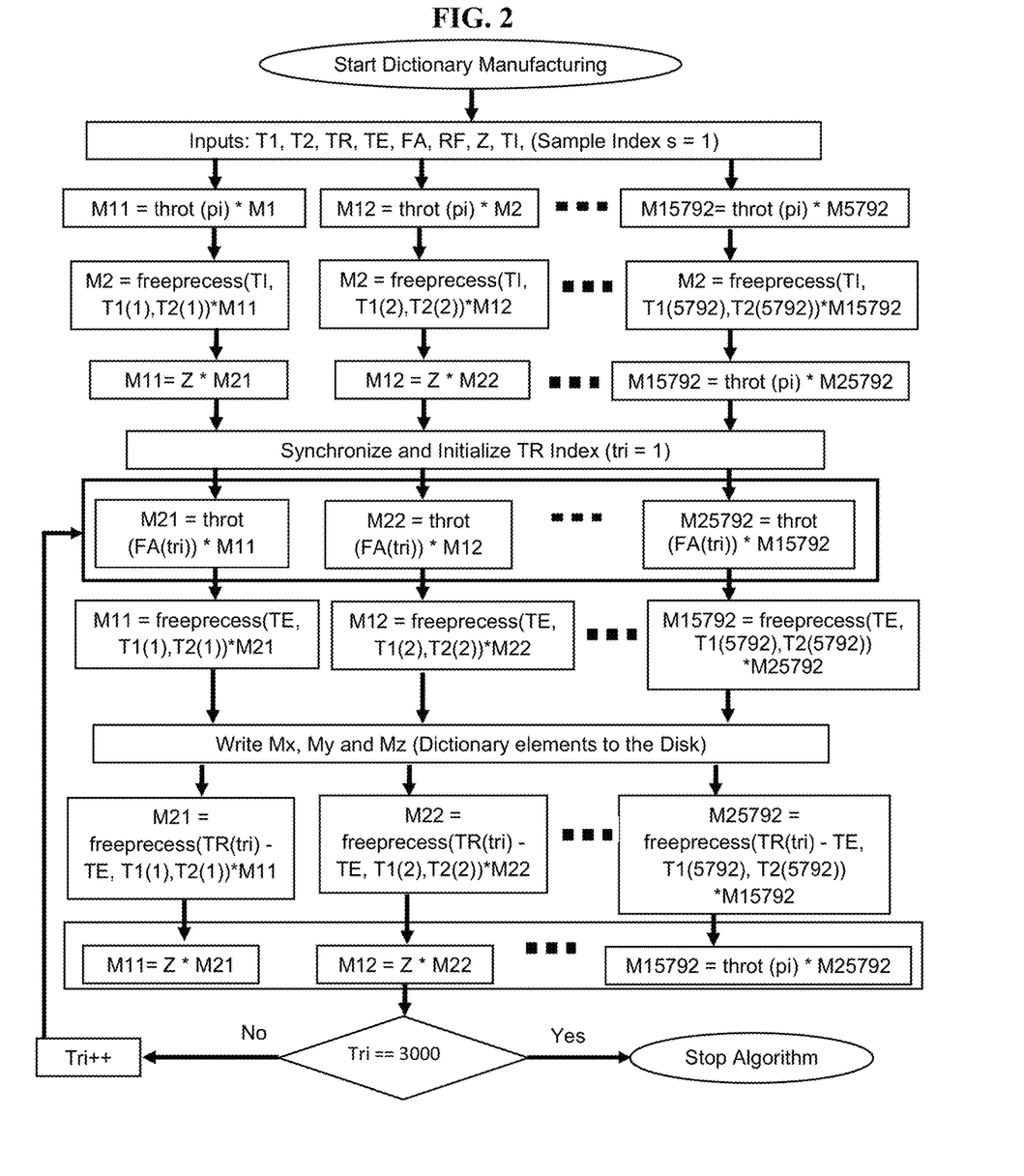
FIG. 2 is an exemplary embodiment with Hybrid Implementation of MRF dictionary manufacturing algorithm on GPUs.
Figure 3:
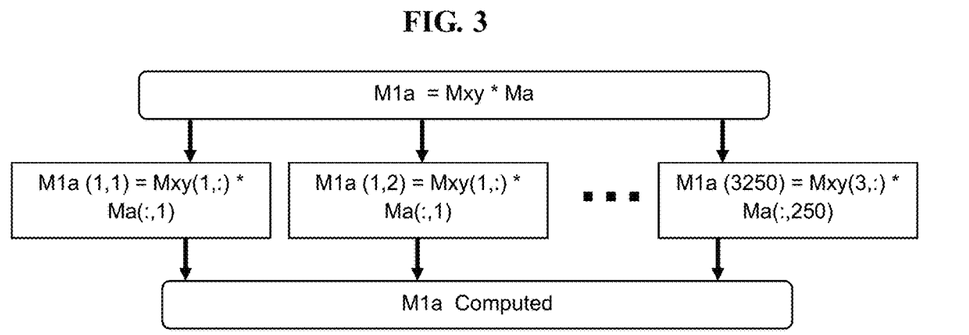
FIG. 3 is CUDA kernel for excitation rotation according to an exemplary embodiment.
Figure 4:
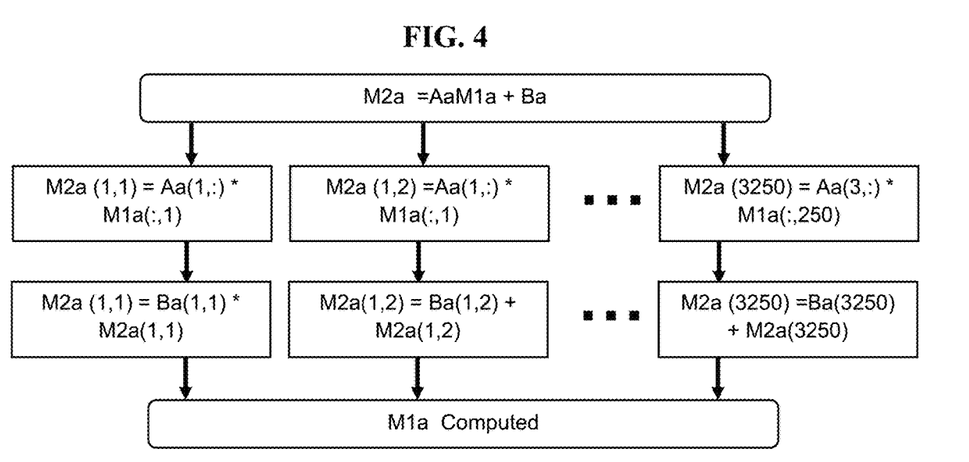
FIG. 4 is CUDA kernel for free induction decay according to an exemplary embodiment.
Figure 5:
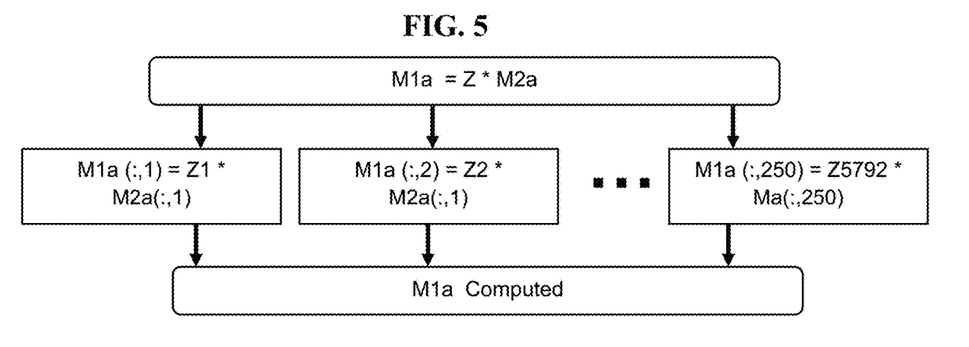
FIG. 5 is CUDA kernel for Precession rotation according to an exemplary embodiment.

FIG. 2 is an exemplary embodiment with Hybrid Implementation of MRF dictionary manufacturing algorithm on GPUs, FIG. 3 is CUDA kernel for excitation rotation according to an exemplary embodiment, FIG. 4 is CUDA kernel for Free induction decay according to an exemplary embodiment, and FIG. 5 is CUDA kernel for Precession rotation according to an exemplary embodiment. Due to the presence of data dependencies, fully parallelized implementation (using GPU only) of MRF dictionary is not possible. However, a hybrid approach utilizing both CPU and GPU is adopted for construction of the MRF dictionary algorithm and is shown in FIG. 2. MRF dictionary is implemented on GPU using three CUDA kernels, i.e. excitation rotation, free precession and precession rotation. A total of 2,172,000 (total number of elements in a 3×250×2896 matrix) threads are launched simultaneously to compute an element in the resultant matrix. The GPU kernel implementation of excitation rotation is shown in FIG. 3, free induction decay is shown in FIG. 4 and precession rotation is shown in FIG. 5 separately.

According to an exemplary embodiment, three different MRF dictionaries based on total number of samples are constructed for comparison purpose i.e. 5792, 8688 and 11584 dictionary samples. The sequential implementation for 5792 sample MRF dictionary requires seventeen million three hundred seventy-six thousand iterations as shown in FIG. 1 (Total Iterations=number of samples×repetition time=5792×3000). The parallel implementation in FIG. 2 for the same sized (5792 samples) MRF dictionary reduces the required iterations to just 6000 (Total Iterations=chunks of samples×repetition time=2×2896) for processing.

The second fundamental module of the MRF is the pattern matching algorithm. MRF pattern matching algorithm is based upon the concept of dot product and further divided into three modules, i.e. Dictionary normalizer, MR signal normalizer and Matrix multiplication. The normalizer module performs the normalization operation on a matrix. The matrix multiplication module calculates the product of two matrices. Using the similarity ratios acquired from the dot-product, the algorithm picks the T1 and T2 values pointed by the index of the maximum correlated predicted signal from predefined MRF dictionary. Finally, the T1 and T2 values are mapped into quantitative maps for the pixel under consideration.

Figure 6:
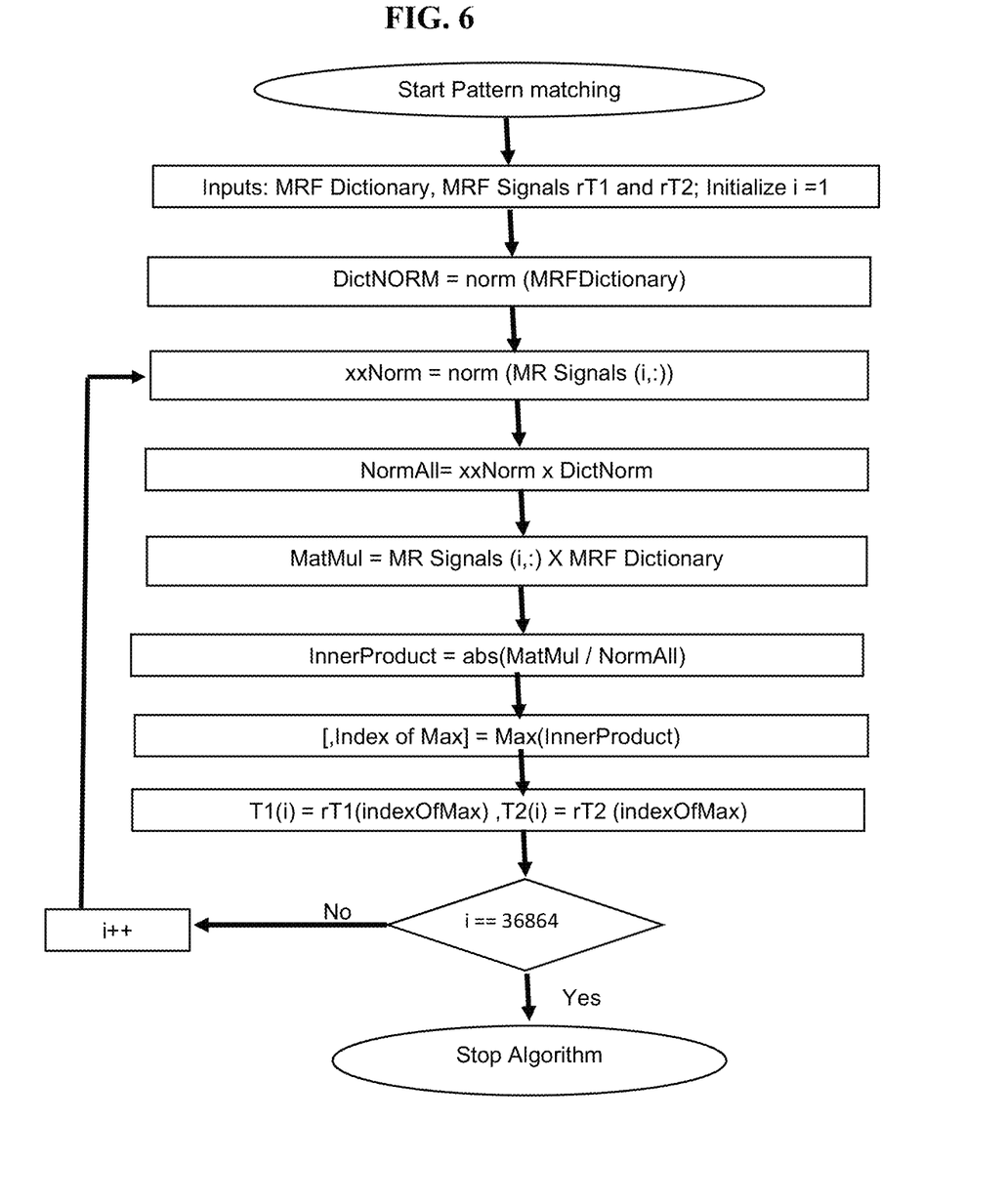
FIG. 6 is a flowchart for the sequential implementation of MRF pattern matching algorithm according to an exemplary embodiment.

FIG. 6 is a flowchart for the sequential implementation of MRF pattern matching algorithm according to an exemplary embodiment. In the conventional implementation of MRF algorithm a single pixel is processed at a time. This will take a significant amount of time to compute the resultant intensity image as illustrated in FIG. 6.

Figure 7:
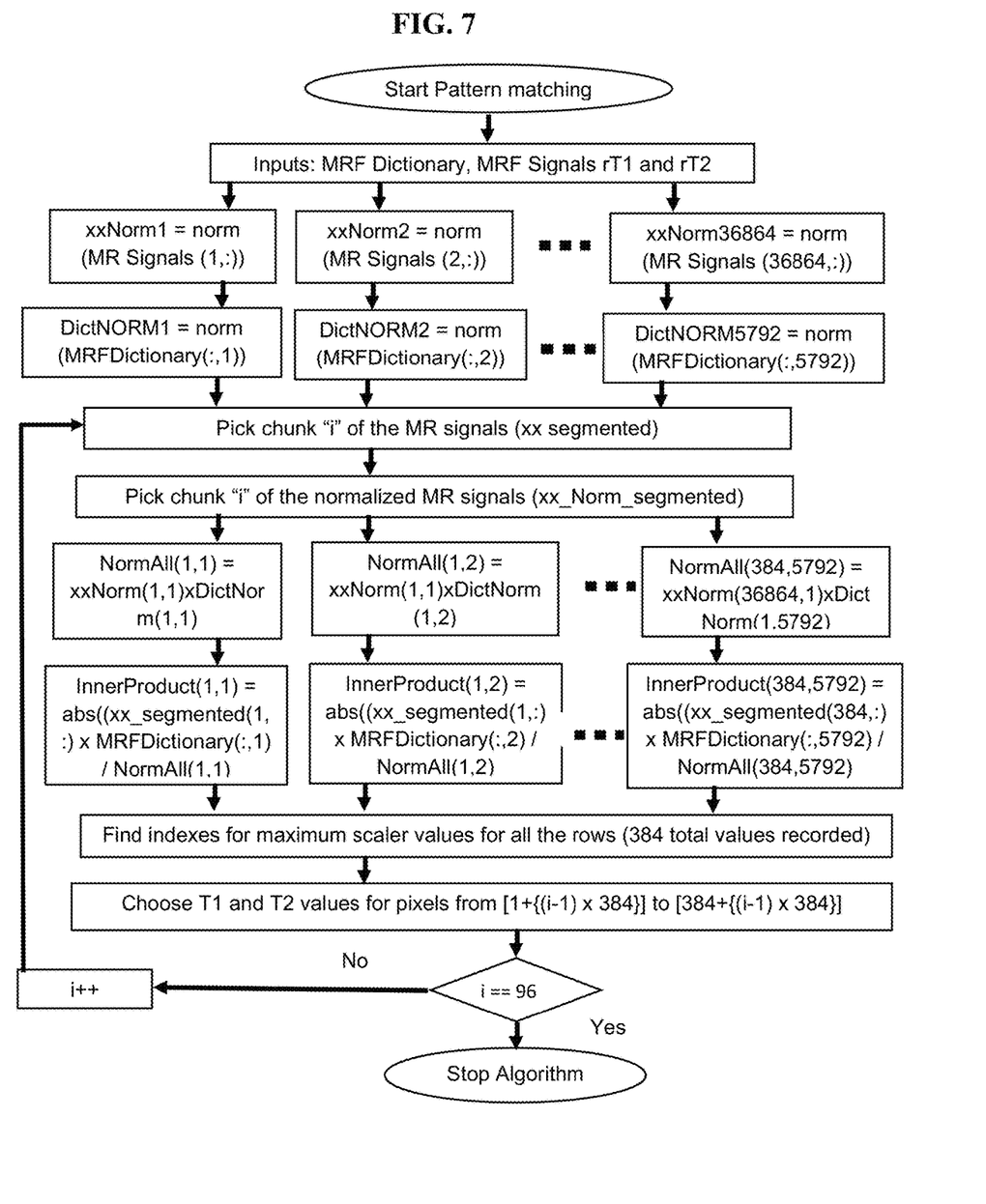
FIG. 7 is a flowchart of a method for parallel implementation of MRF pattern matching algorithm according to an exemplary embodiment.

FIG. 7 is a flowchart of a method for parallel implementation of MRF pattern matching algorithm according to an exemplary embodiment. According to the exemplary embodiment, a hybrid approach is implemented for processing the MRF pattern matching algorithm over GPU and CPU. Maximum possible data parallelization is achieved on GPU. Four GPU kernels are written to parallelize MRF pattern matching algorithm; MR Scanned signal normalizer, MRF dictionary normalizer, Multiplication of normalized values and multiplication of the matrices respectively. The maximum number of CUDA kernel threads is launched simultaneously for processing all the independent data operations to exploit maximum parallelism as illustrated in FIG. 7.

MRF pattern matching algorithm requires to process a huge amount of data and requires large processing/memory resources to process all the data simultaneously e.g. Tesla k40 requires 96 iterations to execute complete MRF pattern matching algorithm as shown in FIG. 7.

The dataset used in the exemplary embodiments is acquired from 1.5 T Espree, Siemens Healthcare scanner with a standard 32-channel head receiver coil. The selected FOV of the acquired dataset is 300 mm×300 mm having slice thickness of 5 mm. The repetition time is randomly selected between 10.5 to 14 ms. The flip angle consists of repeating sinusoidal with a period of 250 acquisitions and alternating maximum flip angles. The radio frequency phase for both patterns is alternated between 0° and 180° on successive radio frequency pulses.

The parallel implementation of MRF dictionary manufacturing algorithm is executed on NVIDIA Tesla K40C. Tesla K40 has 875 MHz clock speed and 2880 computational cores for parallel processing. CUDA language has been used for implementing the proposed algorithm on GPU. The sequential implementation (using C++) of MRF algorithm is executed on Intel Core i7-4510U having clock frequency of 2.6 GHz. For comparison purpose, native algorithm (Matlab version) is also executed on Intel Core i7-4510U having clock frequency of 2.6 GHz.

Figure 8:
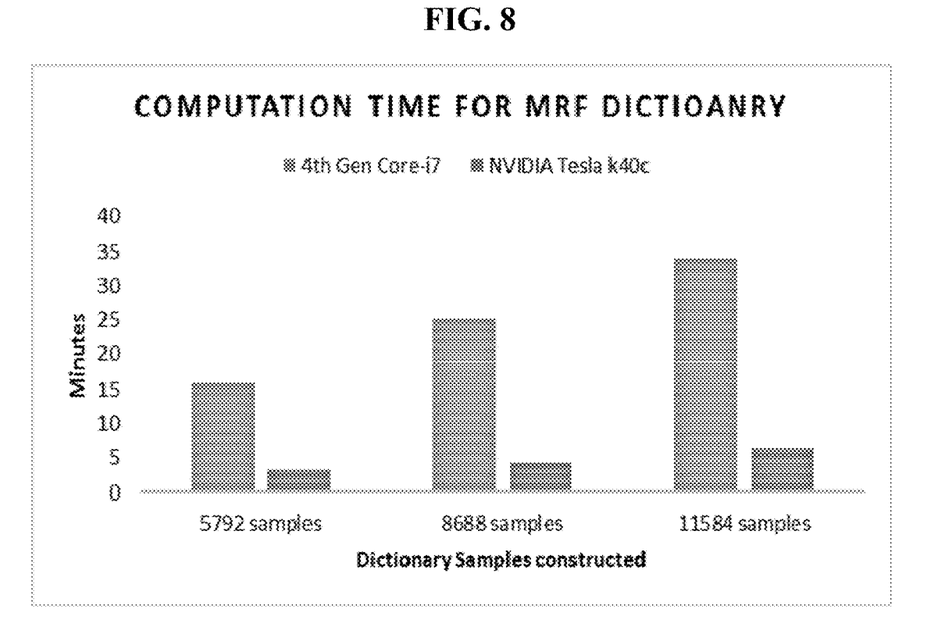
FIG. 8 is a chart to show computation times of MRF Dictionary on CPU vs GPU for different number of samples created by decreasing step size between different values of T1 and T2, according to an exemplary embodiment.

FIG. 8 is a chart to show computation times of MRF Dictionary on CPU vs GPU for different number of samples created by decreasing the step size between different values of T1 and T2, according to an exemplary embodiment. Table 1 shows the execution times of the CPU implementation using C++, native implementation using Matlab (with and without using "mex" command), and the GPU implementation. The respective speed-ups attained are also shown. The computation times for different samples of the MRF dictionary on CPU and GPU are illustrated in FIG. 8. In FIG. 8, different number of data samples is created by varying the step size between different values of T1 and T2 (in the original dataset acquired at Case Western Reserve University).

TABLE 1

Comparison between sequential and parallel implementation

| MRF Dictionary Samples | 4$^{th}$ Gen Core-i7 (seconds) | | | NVIDIA Tesla k40c (seconds) | Speed-up attained (x) | | |
|---|---|---|---|---|---|---|---|
| | C++ | Matlab | Matlab (mex) | | C++ | Matlab | Matlab (mex) |
| 5792 | 960 | 15755 | 262 | 210 | 4.57 | 65.54 | 1.45 |
| 8688 | 1515 | 22158 | 371 | 271 | 5.6 | 80.87 | 1.36 |
| 11584 | 1989 | 29538 | 547 | 395 | 5.03 | 75.90 | 1.38 |

The results in Table 1 show that parallel implementation of MRF dictionary significantly improves the computation time as compared to the conventional approach. The conventional MRF dictionary algorithm performed poorly (in terms of computation time) in MATLAB taking a couple of hours to produce a decent sized dictionary. Making the "mex" files (consist of pre-compiled functions) for MRF dictionary in (conventional MATLAB code) decreases the computation time but still it takes almost one hour. The one other main issue with MATLAB "mex" file approach is if there is any update or modification required in the MRF dictionary a fresh compilation is required to build updated "mex" file that takes a significant amount of time. However, in the method according to exemplary embodiments, updating the MRF dictionary does not require any extra time.

According to an exemplary embodiment, for fair comparison, the optimized implementation of sequential MRF Dictionary algorithm in C++ language is implemented at first stage. Then GPU is used to further reduce the computation time by introducing CUDA kernels for all the operations that process independent data. MRF dictionary manufacturing algorithm on GPU shows significant improvement in reducing the computation times, i.e. almost 65×-80× faster computation times as compared to MATLAB, e.g. 4.5×-5× faster computation times as compared to C++ and 1.45×-1.38× faster computation times as compared to MATLAB with pre-compiled "mex" file.

The sequential implementation of MRF pattern matching algorithm (using C++) is executed on Intel Core i7—4510U 2.6 GHz (CPU). The results show that the pattern matching algorithm takes 4 hours to execute on CPU. The parallel implementation of MRF pattern matching algorithm is executed on different GPUs manufactured by NVIDIA, i.e. Tesla K40 having 2880 computational cores, 12 GB memory and 875 MHz clock speed; GTX 780 having 2304 computational cores, 3 GB memory and 863 MHz clock speed; GTX 560 having 384 computational cores, 1 GB memory and 822 MHz clock speed; and GT 630m having 96 computational cores, 2 GB shared memory and up-to 800 MHz clock speed.

Figure 9:
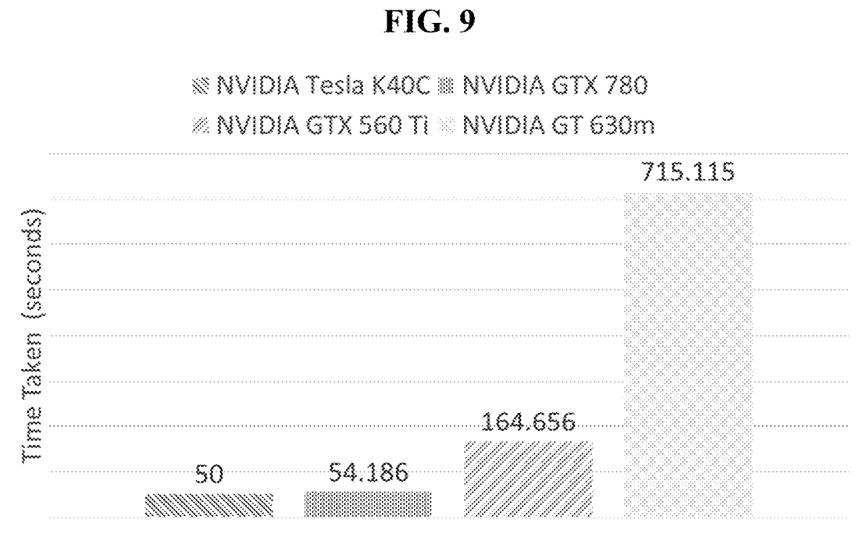
FIG. 9 is a chart to show execution times of the proposed parallel implementation of MRF pattern matching algorithm on various GPUs, according to an exemplary embodiment.

FIG. 9 is a chart to show execution times of the proposed parallel implementation of MRF pattern matching algorithm on various GPUs, according to an exemplary embodiment. The GPU implementation according to an exemplary embodiment executes the algorithm only in 50 seconds on Tesla K40, which is 294 times faster than the CPU implementation. The exemplary implementation on other GPUs (as given above) having different number of CUDA cores with their execution times are illustrated in FIG. 9. The speed-ups attained by the proposed parallel implementation on GPUs in comparison with the CPU implementation are given in Table 3. Table 2 illustrates the MRF Pattern matching algorithm computation time of different implementations using CPU and GPU.

TABLE 2

Computation time of different MRF Pattern matching algorithm implementations using CPU and GPU.

| | 4$^{th}$ Gen Core-i7 | | NVIDIA | NVIDIA | NVIDIA | NVIDIA |
|---|---|---|---|---|---|---|
| | C++ (sec) | Matlab (sec) | Tesla k40c | GTX 780 | GTX 560 | GT 630m |
| Computational Time | 14400 | 5131 | 50 | 54.186 | 164.656 | 715.115 s |

TABLE 3

Speedup attained by different GPUs for MRF pattern matching algorithm

| | NVIDIA Tesla K40C | NVIDIA GTX 780 | NVIDIA GTX 560 | NVIDIA GT 630m |
|---|---|---|---|---|
| Speed-Up (C++ vs CUDA) | 294.90 x | 272.12 x | 89.60 x | 20.62 x |
| Speed-Up (Matlab vs CUDA) | 102.39 x | 94.46 x | 31.08 x | 7.15 x |

Figure 10A:
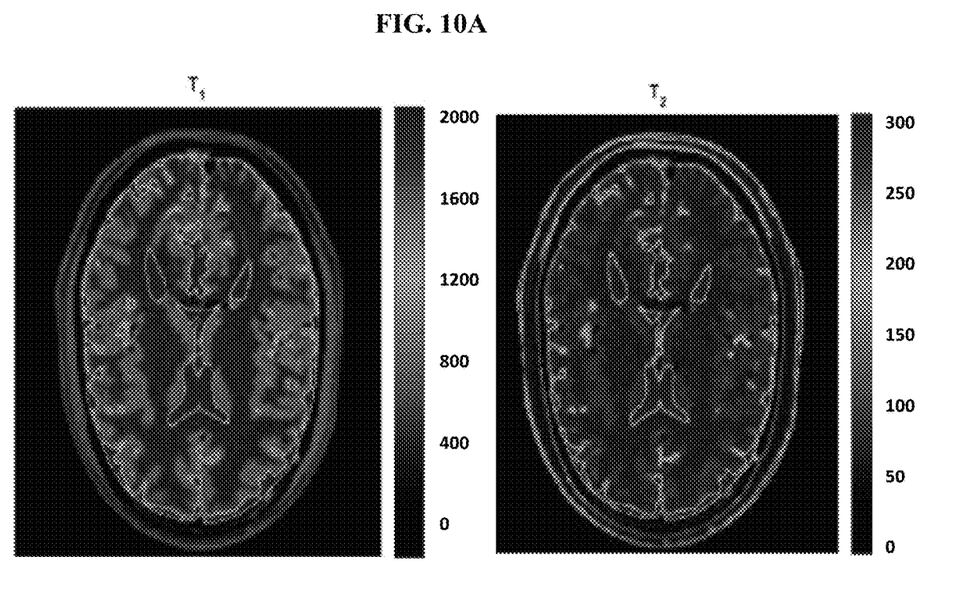
FIG. 10A is MRF intensity map (T1—relaxation and T2—relaxation) reconstructed using the conventional MRF algorithms in Matlab, according to an exemplary embodiment.
Figure 10B:
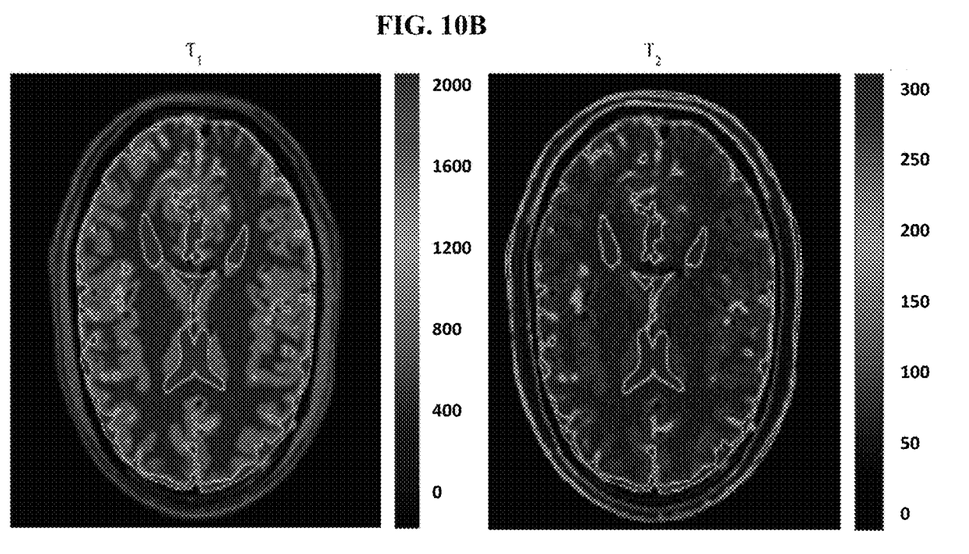
FIG. 10B is MRF intensity map (T1—relaxation and T2—relaxation) reconstructed using C++ implementation, according to an exemplary embodiment.
Figure 10C:
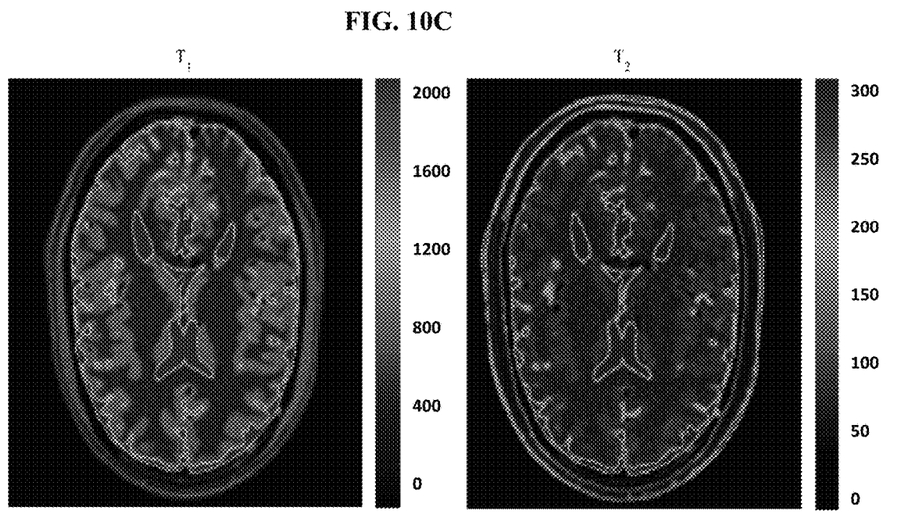
FIG. 10C is MRF intensity map (T1—relaxation and T2—relaxation) reconstructed using the integrated MRF CUDA application, according to an exemplary embodiment.
Figure 10D:
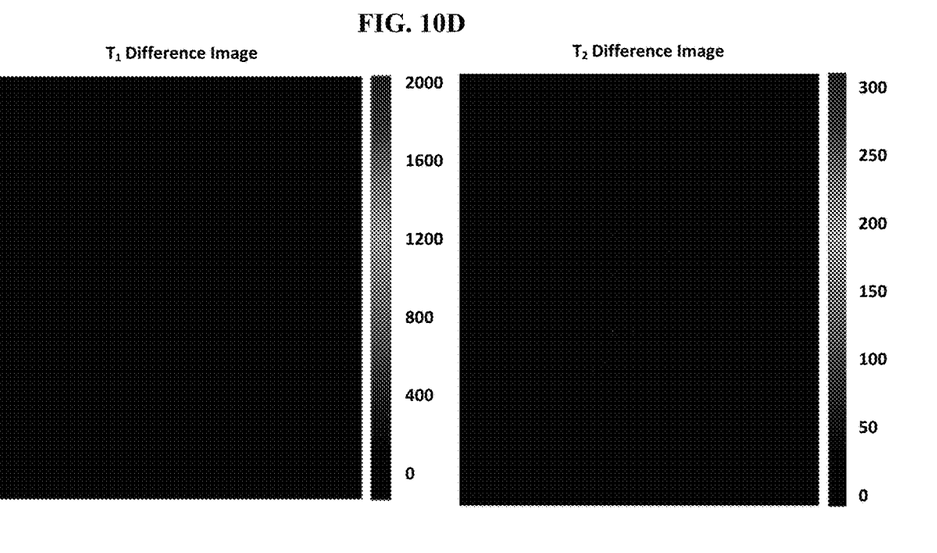
FIG. 10D shows the difference between the maps from FIG. 10A the conventional MRF and maps according to other exemplary embodiments.

FIG. 10A is MRF intensity map (T1—relaxation and T2—relaxation) reconstructed using the conventional MRF algorithms in Matlab, according to an exemplary embodiment. FIG. 10B is MRF intensity map (T1—relaxation and T2—relaxation) reconstructed using C++ implementation, according to an exemplary embodiment. FIG. 10C is MRF intensity map (T1—relaxation and T2—relaxation) reconstructed using the integrated MRF CUDA application, according to an exemplary embodiment. FIG. 10D shows the difference between the maps from FIG. 10A, the conventional MRF and maps according to other exemplary embodiments. FIG. 10A shows the intensity maps obtained by processing the dataset acquired from Case Western Reserve University using conventional MRF algorithm implementation on Matlab. FIG. 10B shows the intensity maps obtained from the sequential implementation (C++) of MRF algorithm. FIG. 10C shows the intensity maps obtained from the parallel implementation (CUDA) MRF algorithm. FIG. 10D shows the difference image of intensity maps between the conventional implementation (FIG. 10A) and parallel implementation (FIG. 10C) to show that they are similar. As illustrated in FIG. 10D, the proposed GPU implementation of the MRF does not compromise the reconstructed image quality while the computation time is significantly reduced (table 2 and table 3).

The method according to the exemplary embodiments is proposed to reduce MRF computation time by exploiting inherent parallelism in MRF algorithm. It is observed that the proposed GPU implementation significantly reduces the computation time of the MRF algorithm down to clinically feasible time without degrading the quality of the results. The main advantage of the exemplary method is a significant improvement in the computation time without reducing the size of data or number of operations required in the native MRF algorithm.

The MRF computation time is directly proportional to the size of the dictionary. An exponential increase in the computation time is observed (Table 1) as the size of dictionary increases. An increase in the size of MRF dictionary is the ultimate requirement to gain improvement in the MRF results and further in depth analysis of tissues. The parallel implementation of MRF algorithm reduces its computation time and makes it possible to increase the size of MRF dictionary in clinically feasible time.

The results show that the implementation of MRF pattern matching on GPU significantly reduces the computation time with no compromise on the image quality. According to exemplary embodiments, a significant reduction (294× times) in the computation time of MRF pattern matching algorithm (table 2 and table 3) is achieved because of the nature of arithmetic operations involved in MRF pattern matching algorithm and the availability of data to be processed. Additionally, all the data samples are to be processed through the same arithmetic operations as shown in FIG. 6 and FIG. 7 (single CUDA kernel is enough to process data in each block). This is an extremely feasible scenario for CUDA framework based GPU implementation to achieve speed up by exploiting maximum parallelism. The GPU based MRF implementation provides cost effective solution to reduce the execution time of conventional MRF algorithm.

What is claimed is:

1. A method, comprising:
    removing all data dependencies of an existing Magnetic Resonance Fingerprinting (MRF) algorithm;
    writing a plurality of kernel modules for execution by cores of a Graphics Processing Unit (GPU) to process Magnetic Resonance (MR) data acquired from a Magnetic Resonance Imaging (MRI) Scanner using a parallel implementation of Magnetic Resonance Fingerprinting (MRF) algorithm on a parallel architecture; and
    launching a number of threads corresponding to each of the available cores of the GPU simultaneously to execute the plurality of kernel modules to achieve a maximum parallelism in the MRF algorithm,
    wherein the plurality of kernel modules comprise:
    a Compute Unified Device Architecture (CUDA) kernel for excitation rotation;
    a CUDA kernel for free induction decay; and
    a CUDA kernel for precession rotation.

2. The method of claim 1, wherein the writing of kernel modules and launching of the number of threads are implemented on the GPU residing on a host computer.

3. The method of claim 1, wherein the parallel architecture supports a CUDA framework.

4. A method, comprising:
    removing all data dependencies of an existing Magnetic Resonance Fingerprinting (MRF) algorithm;
    writing a plurality of kernel modules for execution by cores of a Graphics Processing Unit (GPU) to process Magnetic Resonance (MR) data acquired from a Magnetic Resonance Imaging (MRI) Scanner using a parallel implementation of Magnetic Resonance Fingerprinting (MRF) algorithm on a parallel architecture; and
    launching a number of threads corresponding to each of the available cores of the GPU simultaneously to execute the plurality of kernel modules to achieve a maximum parallelism in the MRF algorithm,
    wherein the plurality of kernel modules comprise:
    a MR scanned signal normalizer kernel;
    a MRF dictionary normalizer kernel;
    a kernel for multiplication of normalized values; and
    a kernel for multiplication of matrices.

5. The method of claim 4, wherein the kernel modules are Compute Unified Device Architecture (CUDA) kernel modules.

6. The method of claim 4, wherein the number of threads are Compute Unified Device Architecture (CUDA) kernel threads.

7. The method of claim 4, wherein the writing of kernel modules and launching of the number of threads are implemented on the GPU residing on a host computer.

8. The method of claim 4, wherein the parallel architecture supports a Compute Unified Device Architecture (CUDA) framework.

* * * * *